United States Patent [19]

Ngo et al.

[11] Patent Number: 5,427,862
[45] Date of Patent: Jun. 27, 1995

[54] PHOTOCURABLE POLYIMIDE COATED GLASS FIBER

[75] Inventors: David D. Ngo, Naperville; Paul J. Cahill, Wheaton; John J. Greczek, River Forest, all of Ill.

[73] Assignee: Amoco Corporation, Chicago, Ill.

[21] Appl. No.: 768,004

[22] Filed: Sep. 30, 1991

Related U.S. Application Data

[63] Continuation-in-part of Ser. No. 522,363, May 8, 1990, abandoned.

[51] Int. Cl.$^6$ .......................... B32B 31/00; C08F 2/46
[52] U.S. Cl. ..................................... 428/435; 427/162; 427/385.5; 427/388.5; 427/389.7; 525/436; 525/353; 372/89; 385/116; 385/147; 524/600; 430/192
[58] Field of Search ............... 525/353, 436; 430/270, 430/325; 524/600; 528/310, 312, 353; 427/162, 385.5, 388.5, 389.7; 428/435; 372/39; 385/116, 147

[56] References Cited

U.S. PATENT DOCUMENTS

| | | | |
|---|---|---|---|
| 4,657,832 | 4/1989 | Pfeifer | 430/18 |
| 4,847,353 | 7/1989 | Watanabe | 528/184 |
| 4,876,329 | 10/1989 | Chiang et al. | 528/353 |
| 5,114,826 | 5/1992 | Kwong et al. | 430/192 |

FOREIGN PATENT DOCUMENTS 321398 6/1990 European Pat. Off. .

*Primary Examiner*—Patrick J. Ryan
*Assistant Examiner*—Richard Weisberger
*Attorney, Agent, or Firm*—Mary Jo Kanady; Wallace L. Oliver

[57] ABSTRACT

An optical glass fiber coated with a protective layer of photocurable polyimide coating which can be prepared from the polymeric condensation product of 6FDA, DMDE, and a photosensitizing moiety. More particularly, the present invention relates to a photocurable polyimide coated glass fiber useful for optic applications.

4 Claims, No Drawings

PHOTOCURABLE POLYIMIDE COATED GLASS FIBER

RELATED APPLICATION

This application is a Continuation-In-Part of U.S. patent application Ser. No. 07/522,363, filed May 8, 1990 now abandoned, fully incorporated herein by reference.

FIELD OF THE INVENTION

This invention relates to a photocurable polyimide coated glass fiber. More particularly, the present invention relates to a photocurable polyimide coated glass fiber useful for optic applications.

BACKGROUND OF THE INVENTION

Optical fibers provide a means to transfer communication and data. Optical fiber transfer has many advantages over the traditional electrical, coaxial or hard-wired transmission systems. Light from a laser or light emitting diode (LED) is modulated very rapidly to encode large amounts of information for transmission by the optical fiber. The output of the modulated LED source is sent through the optical fiber to a receiver (a photo detector) where it is processed (demodulated) to recover the communication or data.

The structure of a typical optical fiber can be described as a layered fiber of glass with a small diameter. The central portion of the fiber is the core and is made up of one type of glass. The core is surrounded by a different type of glass, which is called the cladding. Finally, the glass is coated with a protective jacket. The light-guiding capability of the fiber is dependent upon the properties of the core and cladding while the mechanical strength of the fiber is maintained by the protective jacket.

Light is transmitted through the optical fiber by means of internal reflectance. The cladding material is selected so as to have a lower index of refraction than that of the core material. Light rays that strike the interface between the core and the cladding at angles greater than a critical angle (which is determined for each combination of glass) are reflected back into the core, and through successive reflections are transmitted to the output end of the fiber. Light striking the interface at less than the critical angle is partly reflected and partly refracted into the cladding which results in a partial loss in signal intensity.

A significant consideration in fiber optics is the transmissivity of the fiber, i.e., its ability to propagate light of a given wavelength along the core with a minimum loss of intensity from the input end to the output end of the fiber. The light loss is described as the attenuation rate, expressed in dB (decibel) per kilometer of fiber. Glass fibers are used extensively, particularly for long distance transmission, such as in long-distance telephone lines, which require high transmissivities, and in sensor applications.

A single glass fiber is capable of replacing a very large bundle of individual copper wire. For example, a typical telephone cable may contain over 1,000 pairs of copper wire and have a cross-section diameter of three to four inches. A single glass fiber core/cladding cable capable of handling the same amount of signal might be only one-fiftieth inch in diameter. The core and cladding diameters can vary depending on a particular application. A glass fiber is typically 125 microns in diameter.

Glass optical fibers also find use in illumination applications for transmitting visible light to remote sites where it may be difficult to locate and service a more conventional light source, e.g., light bundles in endoscopes or in environments where electrical sparks could be hazardous.

Glass optical fibers are typically constructed from doped silicas and are very fragile. In addition, their use temperatures are limited to the thermal stability of the protective jacket (coating). Many uses for optical fibers demand higher operating temperatures, for example, sensor applications for oil well exploration and other geothermal applications, sensors for internal combustion engines, and in uses where fire/thermal resistance is important. Typically, polymers having silicone, isocyanate, or acrylate functionalities are used as protective jackets (coatings) on glass fibers. These polymers limit the use of glass fibers to temperatures between 100° C. and 150° C.

Polyimide coatings which are applied as a polyamic acid provide a less satisfactory protective jacket than a polyimide coating of the present invention. For example, a polyamic acid solution is applied at a lower solids content than a polyimide. Therefore, each application of the polyamic acid is a thinner coat than would be applied as a polyimide. A polymer solution having a solution (Brookfield) viscosity of about 8,000 to 10,000 centipoise will generally give satisfactory coating behavior on glass fiber (as compared to acrylate technology). However, the solids content of the polymer solution directly affects the solution viscosity of the polymer. Many conventional polyamic acids have unstable solution viscosities and are typically applied in several layers to achieve a particular thickness. In these multipass manufacturing operations, the desired coating thickness (generally 5 microns or more) is built up through several passes through the manufacturing process.

Solvent removal is another area of concern. The high boiling aprotic solvents used for polyamic acid preparation require high temperatures to remove solvent residue from the polyamic acid. In addition, polyamic acids are generally imidized at high temperatures to form the polyimide. During these high temperature (thermal) imidization processes water of cyclization is released, increasing the potential for bubbles or blisters to form in the polymer coating which can affect the mechanical characteristics of the coating and may interfere with light transmission through the glass fiber. In addition, the solvent removal and imidization steps attributable to the polyamic acid contribute to a slow and expensive manufacturing process because they require long residence times in ovens at high temperatures. On the other hand, fiber coating must be a rapid manufacturing process so that the polymer coating can be applied evenly and efficiently.

A rapid continuous manufacturing process can be achieved by using the polyimide of the present invention where the coating can be applied to the glass fiber, the solvent can be removed and the polyimide can be crosslinked by exposure to actinic radiation at low temperatures in a single pass through the manufacturing process.

Further, a useful polymer coating for glass fiber must have high temperature resistance and have good adhesion characteristics, but still maintain good stripping characteristics. In addition, the coating material must have a low coefficient of linear thermal expansion (CLTE) so as to more closely match that of glass. Otherwise, two different types of coating may be required, one coating to function as a low modulus buffer layer, and the other coating to function as a harder physical barrier against applied stresses from the environment.

The polyimide coated glass fibers of the present invention provide the advantageous characteristics described above. In particular, the coated glass fiber of the present invention provides a glass fiber that has a mechanically strong jacket and that can be exposed to high temperature applications.

Further, the application of the polyimide of the present invention to a glass fiber provides manufacturing advantages. The ability to apply the polyimide to the glass fiber at high solids content means that a thicker coat can be applied and the desired thickness can be achieved with fewer passes, ideally with one pass. Prior art coatings are able to apply approximately 1.5 microns per pass, whereas the present invention can provide up to 10 microns per pass.

Still further, the polymer is applied as a polyimide and although the polyimide coating is exposed to actinic radiation in order to crosslink the polyimide, no further imidization is required. Therefore, prior art problems associated with water formation during the imidization process are avoided. In addition, the polyimide of the present invention is soluble in low boiling point solvents, for example, dichloromethane. Therefore, residual solvent removal is rapid and can be accomplished with a low temperature oven or under the low temperatures associated with UV exposure.

SUMMARY OF THE INVENTION

The present invention provides a photocurable coating from a polyimide having the recurring units

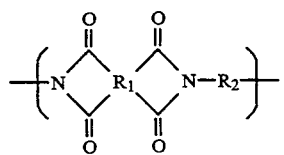

wherein $R_1$ comprises a tetravalent dianhydride moiety in a mole ratio of from about 10:70 mole percent to about 90:30 mole percent of

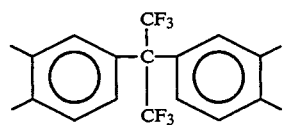

compared to a tetravalent photosensitizing moiety, $R_2$ is

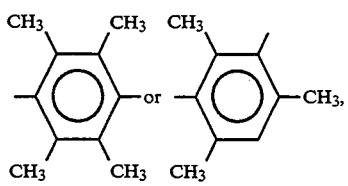

and wherein the number molecular weight average is at least 10,000 g/mol.

As used herein, photosensitizing moiety means a moiety that increases the sensitivity of the polyimide to crosslinking as a result of exposure to actinic radiation.

As used herein, polyamic acid is the precursor to a cured polyimide. When the polymer is first prepared, it is essentially in the polyamic acid form. However, the polymer is in a dynamic state and some polyimide may be present. Likewise, after the polyamic acid is cured to the polyimide form, some polyamic acid may be present. Accordingly, it is to be understood that although the polymer of the present invention is a polyimide, it may contain some degree of polyamic acid.

As used herein, photocurable means that the polyimide of the present invention is photosensitive and will crosslink upon exposure to actinic radiation, such as UV radiation. Crosslinking functions to harden the polymer coating and provide enhanced mechanical properties and improved solvent resistance.

The photocurable polyimide coated glass fiber of the present invention can be used in high temperature environments of up to 525° C. (see Example 1), provides a polymer coating with a low coefficient of thermal expansion (24 ppm/°C, see Example 1), and good adhesion characteristics.

BRIEF DESCRIPTION OF THE INVENTION

The present invention provides a photocurable glass fiber coating from a polyimide having the following recurring units

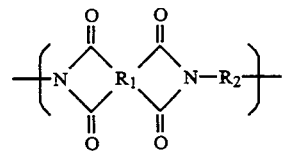

wherein $R_1$ comprises a tetravalent dianhydride moiety in a mole ratio of from about 10:70 mole percent to about 90:30 mole percent of

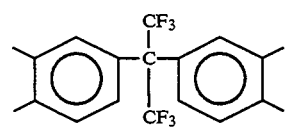

compared to a tetravalent photosensitizing moiety, $R_2$ is

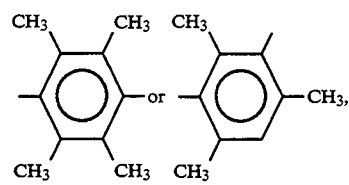

and wherein the number molecular weight average is at least 10,000 g/mol.

In general, moieties which contain a chromophore can function as a photosensitizing moiety. Examples include, but are not limited to,

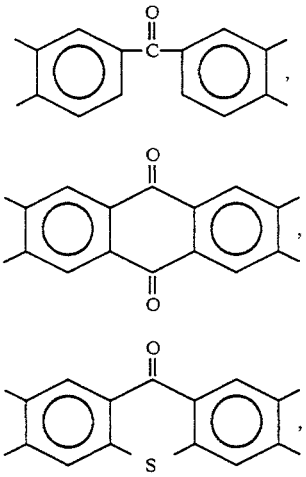

and the like. The photosensitizing moiety is derived from a tetravalent dianhydride and incorporates the isomeric variants of the photosensitizing moieties.

A particularly preferred polyimide is a polyimide having from about 30 to about 90 mole percent photosensitizing moiety derived from BTDA relative to the 6FDA moiety. Because of the reduction in solution Brookfield viscosity, a more preferred concentration is from about 50 to about 90 mole percent BTDA.

A co-initiator may be included in the photocurable polyimide coating composition to further increase the photosensitivity of the polymer. These co-initiators may or may not be included in the polymer backbone. Examples include, but are not limited to, anthraquinone 2-ethylanthraquinone, 2-tert-butylanthraquinone, benzophenone, Michler's ketone, thioxanthone, 3-ketocoumarines, triethylamine, N-methyldiethanolamine, 4-(amino) methylbenzoate, 4(dimethylamino) methylbenzoate, 4-(dimethylamino) benzaldehyde, and the like.

The following abbreviations as used herein are defined as follows:

| ABBREVIATION | FULL NAME |
|---|---|
| 6FDA | 2,2-bis(3,4-dicarboxyphenyl)-hexafluoropropane dianhydride |
| APES | 3-aminopropyl triethoxysilane |
| BTDA | 3,3',4,4'-benzophenone tetracarboxylic acid dianhydride |
| DCC | 1,3-dicyclohexylcarbodiimide |
| MEDA | mesitylene diamine (diaminomesitylene), also called 2,4,6-trimethyl-1,3-phenylenediamine |
| DMDE | diaminodurene, also called 2,3,5,6-tetramethyl-1,4-phenylene diamine |
| NMP | N-methylpyrrolidone |
| PMDA | pyromellitic acid dianhydride |

The photocurable polyimide of the present invention can be prepared as the polycondensation product of components comprising 6FDA and DMDE, or derivatives thereof, and a component that will contribute a photosensitizing moiety, for example, BTDA. Examples of dianhydrides that will contribute a photosensitizing moiety include, but are not limited to, 3,3',4,4'-benzophenone tetracarboxylic acid dianhydride (BTDA), 2,3,6,7-anthraquinone tetracarboxylic acid dianhydride, 2,3,6,7-thioxanthone tetracarboxylic acid dianhydride, and the like, as well as isomers thereof. Examples of diamines include, but are not limited to, the various isomers of benzophenone diamine, anthraquinone diamine, thioxanthone diamine, and the like.

Generally, polyimides are made by mixing a diamine component and a dianhydride component and adding a compatible solvent to form a solution of polyamic acid. The polyamic acid is then imidized by either chemical or thermal methods to form a polyimide.

In greater detail, the dianhydride component and diamine component typically are allowed to react in the presence of polar aprotic solvent to provide a polyamic acid solution. The stoichiometric ratio of the total diamine and the total dianhydride concentrations of the polymer ranges from 0.8 to 1.2, preferably 1.0. When the tetravalent photosensitizing moiety is BTDA, from about 10 to about 90 mole percent BTDA, compared to the total dianhydride, will result in a polyimide that will decrease in solution viscosity as the concentration of BTDA is increased. A range of from about 50 to about 90 mole percent BTDA will provide a polyimide with properties that are well suited for optical applications.

The condensation reaction typically takes place at approximately room (ambient) temperature. Preferably the reaction takes place at less than 30° C. in 3 hours to several days, more preferably between 5 to 24 hours.

In greater detail, the polyamic acid is then imidized using thermal or chemical means. Thermal imidization is typically carried out in the solution solvent at a temperature range typically from about 50°–300° C., preferably from about 120°–180° C., most preferably at about 150° C. Chemical imidization is generally accomplished using dehydrating agents, such as, for example, acetic anhydride or trifluoroacetic anhydride. Other examples of suitable dehydrating agents can be found in Bessonov, M. I. et al., Polyimides—Thermally Stable Polymers, Consultants Bureau, New York, 76–82 (1987), incorporated herein by reference. A particularly suitable chemical imidization composition is the dehydrating agent, acetic anhydride, used in the presence of a catalyst such as pyridine. Also preferred are 1,3-dicyclohexylcarbodiimide (DCC), thionyl chloride, phosphorous trichloride, trifluoroacetic anhydride, and the like.

A solid polyimide can be isolated from solution by precipitating the polyimide solution in low-polarity solvents, such as for example, alkanes such as pentane, hexane, heptane; alcohols such as methanol, ethanol, propanol; ethers such as diethyl ether, and the like. Preferably, the polyimide is precipitated with methanol, washed with solvent, and dried in air or inert atmosphere (such as nitrogen).

The solid polyimide then can be dissolved in a suitable solution solvent to form a coating composition. This composition is used to apply the polyimide coating to the glass fiber. Generally, the polyimide solution will be diluted with a low boiling point inflammable solvent, such as, for example, dichloromethane or with halogenated hydrocarbons. The degree of dilution is based on the thickness requirement of the final coating and the desired viscosity and solids content of the solution. Typically, solutions of the polyimide are applied to the glass fiber with solids concentrations from about 5 to about 60 weight percent and preferably from about 5 to about 30 weight percent. Clean, dry, high-purity solvent (solution solvent) is generally used as the diluent. The diluted solution can be pressure-filtered before further processing.

Further, the glass fiber can be treated with an adhesion promoter provided that the adhesion promoter does not interfere with the light transmission of the glass fiber.

The polyimide of the present invention is photosensitive and the coated glass fiber can be exposed to actinic radiation to effect crosslinking of the polymer. This photocrosslinking is brought about by actinic, or high-energy radiation, for example, by light within the region of 600 to 200 nm or the deep ultraviolet region, or by X-rays, laser light, electron beams, and the like.

Photosensitivity is affected by the molecular weight of the polyimide. For example, a 6FDA/BTDA/DMDE (50/50/100) polyimide (Example 14) having a number average molecular weight (MWn) of 4,680 was compared to a 6FDA/BTDA/DMDE (50/50/100) polyimide (Example 16) having a MWn of 15,550. The photosensitivity was found to be 272 mJ/cm$^2$ and 69 mJ/cm$^2$, respectively. The number molecular weight average is preferably above approximately 10,000 g/mol.

Other customary additives which do not have an adverse influence on the photosensitivity of the photoimageable polyimide coating can be incorporated in the coating during preparation of the coating composition. Examples of these additives are delustering agents, flow control agents, fine-particled fillers, flameproofing agents, fluorescent brighteners, antioxidants, light stabilizers, stabilizers, dyes, pigments, adhesion promoters and antihalo dyes.

The following examples will serve to illustrate certain embodiments of the herein disclosed invention. These examples should not, however, be construed as limiting the scope of the invention as there are many variations which may be made thereon without departing from the spirit of the disclosed invention, as those of skill in the art will recognize.

EXAMPLES

Unless otherwise indicated, all percents used are weight percents.

All monomers were stored under nitrogen atmosphere.

Starting Materials 3,3',4,4'-Benzophenone tertracarboxylic acid dianhydride (BTDA, 99.7% purity by Differential Scanning Calorimetry (DSC) method).

Hexafluoroisopropylidenebis(phthalic dianhydride) (6FDA) was further recrystallized in a mixed solvent (acetic anhydride/acetic acid 1:3 v/v) and dried to constant weight (130° C.; 1 mm Hg) to provide a white solid of 99.4% purity.

Inherent Viscosity (IV)

Inherent viscosity was determined from 0.5% w/v solution of the polyimide in NMP at 25° C.

Glass Transition Temperature (Tg) by Thermal Mechanical Analysis (TMA)

Tg was determined as described in ASTM E831-86.

Molecular Weight

Molecular weight was determined by Gel Permeation Chromatography (GPC) as described in ASTM D3593-80.

Onset of Degradation

Onset of degradation (TGA) was determined using a Omnitherm® Advantage II TGA model 1,000; Start temperature was 40° C.; Final temperature was 840° C.; Ramp rate was 10° C./min.

Coefficient of Thermal Linear Expansion

Coefficient of thermal linear expansion was determined using ASTM E831-86.

Tensile Modulus

Tensile Modulus was determined using ASTM-D882.

Density

Density was determined using ASTM D792.

Photosensitivity

Photosensitivity was measured as the incident input energy (or dose) per unit area at a particular polyimide thickness that was required to effect crosslinking. Evidence of crosslinking, therefore, indicated that a particular polymer was photosensitive. In this case, the photosensitivity of the polymer was determined by calculating the amount of light that affected the photocrosslinking in the polymer sufficiently to produce a discrete image of 3 microns or better using a DITRIC® test mask. A DITRIC test mask is an optical gradient mask that contains repetitive patterns etched into the chrome mask and that also has different optical gradients.

Example 1

PREPARATION OF THE POLYMER

A clean and dry 100 ml glass kettle with an overhead paddle stirrer was charged in the following order: DMDE (2.46 g), BTDA (2.434 g), 6FDA (3.333 g), NMP (75 g). The remainder of the kettle was assembled and purged with nitrogen for about 5 minutes. Stirring was started and continued for 16 hours, at which time the solution became a viscous and straw-like solution of 10% solids. The polyamic acid solution was further diluted with 100 ml of NMP. The polyamic acid was chemically imidized by adding a mixture composed of 10 ml of acetic anhydride, 8 ml of pyridine, 15 ml of benzene, and 14 ml of NMP, the resulting polyimide solution was maintained at 50° C. with agitation for 2 hours to give a viscous orange solution. Precipitation in methanol (900 ml) and filtration under reduced pressure afforded 7.72 g (94%) of polyimide after drying under high vacuum at about 80° C. The physical and mechanical properties are detailed below.

Inherent Viscosity: 0.63 dl/g

Thermal Properties:
  Tg (TMA) 398° C.
  Onset of
  Degradation (TGA) 489° C. (in nitrogen)
  Expansion (TMA)
    50°–250° C. 24 ppm/°C.

photosensitivity
  Photosensitivity 64 mJ/cm$^2$ at 2 micron thickness
  broad band UV Physical Properties
  Water Absorption 3.4% (25° C., 100% R.H.)
  Tensile Modulus 3.5 GPa
  Density 1.32 g/cc
  Refractive Index 1.59

Impurities
  Na less than 1 ppm
  Cl less than 2 ppm
  Filtered 0.5 microns

APPLICATION OF POLYMER TO GLASS

Lengths of phosphosilicate glass fiber were taped at the top and the bottom of the fiber lengths and were weighted so that they would hang relatively straight. The glass fiber was coated with a 9% solution of the polyimide of Example 1 in dichloromethane. The coating was applied by running a syringe filled with the polymer solution down the length of the fiber. Thin, apparently uniform, coatings were obtained over some portions of the fibers. The polyimide coating was crosslinked by exposure to UV radiation. The coating thickness was approximately 50 microns.

Example 2

Polyimide from 6FDA/BTDA/MEDA (10:90:100)

Using 6FDA (4.440 g), BTDA (29.000 g), and MEDA (15.000 g), Example 2 was prepared in a manner similar to Example 1 above to provide approximately 42.8 g (95.4%) of polyimide.

Inherent viscosity (0.5% solution in NMP) 0.76 dL/g
Solution viscosity (Brookfield, 12% solid in GBL) 166 cps

Example 3

Polyimide from 6FDA/BTDA/MEDA (50:50:100)

Using 6FDA (22.200 g), BTDA (16.100 g), and MEDA (15.000 g), Example 3 was prepared in a manner similar to Example 1 above to provide approximately 46.5 g (93.4%) of polyimide.

Inherent viscosity (0.5% solution in NMP) 0.82 dL/g
Solution viscosity (Brookfield, 12% solid in GBL) 255 cps

Example 4

Polyimide from 6FDA/BTDA/MEDA (70:30:100)

Using 6FDA (31.100 g), BTDA (9.670 g), and MEDA (15.000 g), Example 4 was prepared in a manner similar to Example 1 above to provide approximately 49.5 g (95%) of polyimide.

Inherent viscosity (0.5% solution in NMP) 0.85 dL/g
Solution viscosity (Brookfield, 12% solid in GBL) 374 cps

Examples 5–12

POLYMER PREPARATION

The polymer was prepared in a manner similar to that described in Example 1 to produce a powdered polyimide resin of 50/50/100 6FDA/BTDA/DMDE with an IV of approximately 0.9 dl/g. The powdered polyimide resin was dissolved in dichloromethane to provide a polymer solution having from about 10% to about 15% solids. Glass fiber was drawn and subsequently coated on a fiber draw tower.

FIBER PREPARATION

A drawing tower of approximately 7 meters was used to draw and coat the glass fiber. The glass preform or rodstock was melted in a graphite resistance furnace and drawn down through a diameter gauge and a pinch wheel before entering a coating cup which was positioned on the coating shelf. The coating cup contained the coating material which was dissolved in dichloromethane. The fiber entered the enclosed cup concentrically through an opening in the cup's top cover and exited through a concentric bottom aperture. The diameter of the bottom aperture was carefully selected to provide the optimal annular spacing between the fiber and the circular aperture. After passing through the coating cup the coated fiber passed thorough a concentricity monitor and then through a thermal curing furnace. The thermal curing furnace was an ASTRO® Model Number 1285 which had a 10 inch outside diameter and a 1 inch inside diameter. In addition, the furnace had a 29 inch heated length tubular oven with its own power supply, automatic temperature control, control thermocouple and quartz liner. Next, the coated fiber passed through a UV curing lamp (Fusion Systems® Model Number F450) for UV curing. After passing through a final diameter gauge the fiber was pulled onto a bottom capstan before being spooled onto a take-up system. This configuration allowed the fiber to be pulled through a coating apparatus directly into the thermal casting furnace and the remaining UV curing (crosslinking) system.

As a preliminary run, quartz rodstock (1 m by 19 mm) was melted and the fiber was threaded through the components on the tower. Upon reaching the desired fiber diameter, the coating cup was filled with a polyimide solution (in dichloromethane) and capped to eliminate skinning of the surface resulting from solvent evaporation. As the coated fiber left the capstan (bottom fiber pulling device) the coating was examined for smoothness and concentricity.

The thermal casting unit was shunted to produce a profile with the highest temperature at the exit of the furnace to drive off the solvent. The temperature at the entrance of the furnace was kept close to the boiling point of the solvent (about 40° C. for dichloromethane) in order to permit the solvent to boil relatively slowly to produce a smooth finish. The resin cured well and a variety of casting and curing method combinations were used. Some combinations were thermal and UV, UV only, and UV with $N_2$ applied. The UV unit was quenched with Nitrogen gas to lower the temperature from 520° C. to 360° C., as well as to assist in the removal of residual solvents. The combination of casting and curing systems was a thermal cast unit with a high exit temperature for solvent removal and a UV cure system to crosslink the polymer. Where thermal casting was not used, residual solvent was removed by the incidental heat associated with the UV lamp.

The draw process parameters were set for production of standard size fiber (125 microns or 140 microns).

The influence of draw speed on the fiber diameter was balanced by the preform feed rate. As the draw speed increased the fiber diameter decreased unless the preform was fed into the furnace at a faster rate. However, if the preform feed rate was held constant, the fiber diameter could be increased or decreased by increasing or decreasing the draw speed. Depending on the initial preform rate a variation of 10 cm/sec increased or decreased fiber diameter by 20 to 30 microns. The draw speed for the first runs was about 20 cm/sec to allow for greater residence time in curing units.

Die sizes were determined from results recorded when the fiber size matched good quality coating. The delta, or difference, of the die and fiber diameters was recorded and a determination was made to use that delta for optimizing the fiber size and coating thickness. Also affecting die size determination was the viscosity of the resin in solution.

The thickness of the coating (buffer size) of commercial single pass polyimide coated fiber is on the order of 3 microns. The cured buffer size is a result of the amount of wet material applied, the percent of shrinkage of the coating material during cure, and the amount of volatile byproduct released (for example, water). If roughness appeared, the roughness was generally controlled by controlling any weeping of coating material from the die. Weeping was controlled through balancing draw speed, viscosity adjustment, and the fiber-to-die diameter ratio.

The viscosity of the solution was directly related to the percent solids in the solution. For the initial runs a solution of 10 percent solids resulted in weeping from the die due to low viscosity and this caused irregular coating. Later runs were made with solutions having 15 percent solids and the annular space between the fiber and the die was approximately 100 microns yielding good coatings on the order of 5 microns radially.

The optimum draw parameters were found to be:
(a) a resin solution in an open cup at 15% solids,
(b) a die with a 100 microns annulus,
(c) a thermal cure having a 35° C. entrance and 120° C. exit,
(d) a UV cure not quenched with N2, and
(e) a draw speed of 20 cm/sec, producing fiber with a 125 micrometer outside diameter (OD) and a 10 micrometer coating in a single pass. Thicker coatings result from additional passes.

The variable values used in coating quartz rodstock Examples 5–10 are detailed in Table I below.

Two types of preforms were used: one to manufacture multimode fiber (Example 11), and another to manufacture singlemode fiber (Example 12). A single mode fiber is an optical waveguide in which only the lowest-order bound mode, which may consist of a pair of orthogonally polarized fields, can propagate at the wavelength of interest. A multimode fiber is an optical waveguide that will allow more than one bound mode to propagate. The multimode fiber preform is step-index and was designed to produce a fiber with a 50 micrometer core and a 125 micrometer cladding. The singlemode fiber has an index profile with a 9 micrometer core and a 125 micrometer cladding.

Examples 11 and 12 were prepared by placing the preform in the furnace, pulling into fiber, threading through the components, coating, inspecting, and spooling as described for Examples 5–10 above. The variable values used in coating Examples 11–12 are detailed in Table II below.

TABLE I

| EXAMPLE NO. | THERMAL CURE OVEN (°C.) | UV CURE | FIBER DIA. (μm) | DRAW SPEED (cm/sec) | DIE SIZE (μm) | BUFFER SIZE (μm) |
| --- | --- | --- | --- | --- | --- | --- |
| 5 | 38–156 | on-no N2 | 125 to 200 | 15–20 | 320 | 8 |
| 6 | not used | on-no N2 | 125 to 200 | 15–20 | 320 | 9 |
| 7 | 37–76 | on-w/N2 @ 10 gpsi | 200–125 | 15 | 320 | 1 to 8 |
| 8 | 37–76 off off | off on- w/N2 on-no N2 | 125– 200– 105 majority 105 | 15 & 50 all 105 @ 50 | 320 | −10 |
| 9 | 32–77 | on-no N2 | 125 | 30 | 508 | −40 |
| 10 | 33–82 | on-no N2 | 200 thru 125 | 20 | 320 | −15 |

| EXAMPLE NO. | SOLUTION % SOLIDS | TEMP. OF SOLUTION | OBSERVATIONS | COMMENTS |
| --- | --- | --- | --- | --- |
| 5 | 10 | 24 | dye weeping at both diameters- orange peel surface under magnification | weeped material cures on tip of dye and wipes coating off fiber. Need to increase viscosity |
| 6 | 10.5 by evap. from 10 | 24 | dye weeping at both diameters orange peel surface | appears curing temperatures too high |
| 7 | 11.2 by evap. from 10 | 24 | weeping at 200 μm and more weeping at 125 μm-surface smooth (similar to commercial coatings | Need to increase viscosity increase |
| 8 | 14.9 by evap. from 10 | 25 | clot on one edge of dye at slow speed-faster speed may reduce time for weeped material to 'set up' | |
| 9 | 13.4 by mix | 25 | Weeping at bottom of die. Clot cured and wiped coating. Viscosity not as high. Popping thru UV. | Need to raise viscosity and/or reduce ratio of fiber to die |
| 10 | 15 by mix | 25 | smooth coating @ 200 μm rough @ 175 μm Popping thru UV @ 125 μm and 150 μm | Developed die size for next draw using die and fiber size. |

TABLE II

| EXAMPLE NO. | THERMAL CURE OVEN (°C.) | UV CURE | FIBER DIA. (μm) | DRAW SPEED (cm/sec) | DIE SIZE (μm) | COAT THICK. (μm) |
| --- | --- | --- | --- | --- | --- | --- |
| 11 | 37–88 | on-no N2 | 125 to 140 | 18 | 244 | 10 |
| 12 | 47–108 | on-no N2 | 125 | 24 | 216 | 10 |

| EXAMPLE NO. | SOLUTION % SOLIDS | TEMP. OF SOLUTION | OBSERVATIONS | COMMENTS |
| --- | --- | --- | --- | --- |
| 11 | 15 | 24 | trying for 15 μm coat by using a die/fiber delta of 120 μm but weeping. Increased fiber diameter to correct. | die/fiber delta needs to be ≦100 μm |
| 12 | 15 | 24 | Die weeping. Increase draw rate | Good coat. Concentricity off |

TABLE II-continued

| corrected. | slightly. |
|---|---|

Comparative Example A

A commercially available polyimide-coated glass fiber (Polymicro ® product number FHP 100110125) was tested to provide a comparison to the polyimide of the present invention.

A series of tests were run to determine the suitability of the present invention as a polyimide-coated glass fiber. These tests are standardized Fiber Optic Test Procedures (FOTP) which are published by the Engineering Department, Electronic Industries Association and are referred to herein as, for example, FOTP-66.

HIGH TEMPERATURE EFFECTS

Eight coating samples from Example 8 were inserted into a kiln at room temperature. The kiln was then fired and as the kiln reached the target temperatures of 200° C., 425° C., 490° C., and 525° C. the samples were removed and examined. The samples that were tested were cured with UV (no thermal cure), four with $N_2$ applied and four with no $N_2$ applied.

All samples were first examined under a microscope at room temperature for any characteristic markings or qualities (i.e., streaking, blistering, bubbles). When the target temperature was reached, each sample was removed, inspected and its characteristics compared to those of the same sample at room temperature.

The samples that had UV curing with $N_2$ remained unchanged up to 425° C. at which point discoloration started. At 490° C. discoloration continued and the coating could be wiped off.

The samples that had UV curing without $N_2$ remained unchanged up to 490° C. at which point discoloring started. At 500° C. the Comparative Example A fiber had discolored more than the fiber of the present invention. At 525° C. the coating was still intact but appeared to have a different texture.

These observations are reported in Table III below.

and a razor was pulled across the coating until it came loose, the same was done after cycling and the results were compared. No changes were observed after the temperature cycling test.

TABLE IV

| TIME (min.) | TEMP (°C.) |
|---|---|
| 0 | 46.6 |
| 34 | 10.0 |
| 90 | −10.0 |
| 154 | −25.0 |
| 204 | −40.0 |
| 308 | −40.0 |
| 366 | 25.0 |
| 488 | 85.1 |
| 508 | 24.9 |
| 760 | 25.5 |

TEMPERATURE/HUMIDITY CYCLING WITH OPTICAL, MONITORING

This test was conducted in a manner similar to that described in FOTP-162, Fiber Optic Cable Temperature-Humidity Cycling. Two spools of 100 m each were placed in the SM 32C Thermotron temperature-humidity test chamber. One spool contained the multimode optical fiber from Example 11 (core diameter/cladded diameter/coated fiber diameter: 56/140/150) and the other spool contained the singlemode optical fiber from Example 12 (9/120/135). These spools were obtained by re-spooling Examples 11 and 12, both of which had approximately a 5 micrometer radial coating. The multimode fiber from Example 11 was injected with an 850 nanometer LED which was monitored by using a 2 by 2 coupler, i.e., one input leg was injected by the LED, one output leg was detected as a reference and the other output leg was used to launch light into the spool of multimode fiber.

The spool of singlemode fiber was injected in a simi-

TABLE III

| Fiber # & Cure Unit Settings. | Temp (°C.) | Coating Thickness (μm) | OBSERVATIONS | |
|---|---|---|---|---|
| | | | Before | After |
| 115(P)no $N_2$ | 200 | 10 | few bubbles | no change |
| 115(P)w/$N_2$ | 200 | 7 | some stripes and bubbles w/larger bubbles (5× the small) on one side | no change |
| 115(P)no $N_2$ | 425 | 9 | few bubbles but w/a few larger bubbles | no change |
| 115(P)w/$N_2$ | 425 | 7 | some stripes and bubbles w/larger bubbles on one side | slight discoloration |
| 115(P)no $N_2$ | 490 | 10.5 | few bubbles but a couple of larger bubbles also | discolored some but not as much as "w/$N_2$" at same temp |
| 115(P)w/$N_2$ | 490 | 6 | small bubbles, and big bubbles on one side | discolored and some of the coating wiped off |
| 115(P)no $N_2$ | 525 | 9.5 | few bubbles | coating seemed to change texture |
| 115(P)w/$N_2$ | 525 | 5.5 | some stripes and bubbles w/larger bubbles (10× the small) on one side | discolored and the coating wiped off |

TEMPERATURE CYCLING

Samples of Examples 5-10 were placed in a Thermotron ® environmental testing chamber, model number SM32C. The chamber cycles temperature and humidity was programmed by a Thermotron controller, model number 2800. The temperature cycle is reported in Table IV below. For Examples 5-10, the humidity averaged approximately 40%. The samples were inspected before and after testing for coating characteristic changes. Before testing, the samples were taped down lar way by using a laser diode operating at 1300 nanometers. Again another coupler split the injected light to a reference detector and the singlemode fiber spool. Both spools were placed in the forward center of the test chamber on stainless steel racks approximately 3 inches high. Two two-meter lengths of fiber extended from each spool through the access port to the injection sources and detectors. Each spool had two one-meter lengths of fiber extended from each spool through the access port to the injection sources and detectors. Each spool had two one-meter lengths of fiber outside the chamber and two one-meter lengths inside.

Four Germanium detectors were used, one for each source reference and one for each type of fiber. The detector outputs were collected by a United Detector Technologies ® (UDT) optometer, model number S-390, with a general purpose interface board (GPIB). The Thermotron test chamber was also configured for a GPIB interface. A computer (IBM ®, model XT) was programmed to address and monitor both the optometer and the test chamber and store time, temperature, humidity and the values from the four detectors every fifteen minutes.

The Thermotron test chamber was 32 ft$^3$ with a temperature range of from about $-68°$ C. to about $+177°$ C. and relative humidity range of from about 20% to about 95%. The chamber was controlled by a 2800 programmer/controller which had a plus/minus 1.1° C. tolerance.

The spools were cycled three times, once with temperature only, and twice with temperature and humidity. The temperature cycle used in the first test was repeated in the following tests. The temperature cycle is reported in Table V.

TABLE V

| TIME (min.) | TEMP (°C.) |
|---|---|
| 0 | 29.7 |
| 6 | 65.1 |
| 11 | 65.0 |
| 18 | 24.9 |
| 24 | 65.1 |
| 29 | 65.0 |
| 36 | −10.1 |
| 42 | −10.0 |
| 48 | 26.4 |

The temperature-humidity cycle is reported in Table VI.

TABLE VI

| Time (min.) | Temp. (°C.) | Relative Humidity (%) |
|---|---|---|
| 0 | 40.8 | 90.1 |
| 7 | 65.0 | 89.9 |
| 12 | 65.0 | 89.0 |
| 18 | 25.4 | 87.9 |
| 25 | 65.0 | 89.9 |
| 30 | 64.8 | 90.3 |
| 33 | 27.3 | 49.7 |
| 35 | 4.9 | 78.1 |
| 36 | −10.0 | 100.0 |
| 40 | −10.1 | 100.0 |
| 43 | −4.0 | 100.0 |
| 48 | 13.5 | 54.3 |
| 51 | 21.2 | 86.8 |

The entire cycle took 12 hours consisting of 8 one and one-half hour intervals. The first interval raised the temperature from 25° C. to 65° C. over 1.5 hours. The next interval was held at a constant humidity of approximately 65° C. for 1.5 hours. The following intervals took the temperature from 65° C. to 25° C. (over 1.5 hours) back to 65° C. (over 1.5 hours) followed by a 1.5 hour hold at 65° C. before lowering to −10° C. over 1.5 hours. The temperature of −10° C. was held for 1.5 hours before raising to 25° C. in 1.5 hours to end the cycle.

The second and third tests had humidity added to the cycling. The relative humidity inside the chamber was held at 90% during the temperature cycling.

The time, temperature, and dB of optical power for the multimode fiber of Example 11 are reported in Table VII.

TABLE VII

| Time (min.) | Temp. (°C.) | dB* MM** |
|---|---|---|
| 0 | 29.7 | −0.008 |
| 6 | 65.1 | −1.210 |
| 11 | 65.0 | −0.518 |
| 15 | 44.9 | 0.002 |
| 18 | 24.9 | 0.001 |
| 21 | 45.1 | 0.004 |
| 25 | 65.0 | −0.418 |
| 29 | 65.0 | −0.271 |
| 32 | 39.6 | 0.047 |
| 36 | −10.1 | −0.010 |
| 42 | −10.0 | −0.004 |
| 48 | 26.4 | 0.041 |

*decibel
**MM multimode

The multimode fiber had a $-1.3$ dB drop initially due to the increase in temperature. During the next high temperature cycle the drop was $-0.04$ dB, the decrease is believed to be due to the adjustment of the spool from the first high temperature cycle.

The time, temperature, and dB of optical power for the singlemode fiber of Example 12 are reported in Table VIII.

TABLE VIII

| Time (min.) | Temp. (°C.) | dB* SM** |
|---|---|---|
| 0 | 29.7 | −0.000 |
| 6 | 65.1 | −0.056 |
| 11 | 65.0 | −0.056 |
| 18 | 24.9 | −0.029 |
| 24 | 65.1 | −0.045 |
| 29 | 65.0 | −0.061 |
| 36 | −10.1 | −0.013 |
| 40 | −10.0 | −0.032 |
| 48 | 26.4 | −0.016 |

*decibel
**SM singlemode

Table VIII indicates that there was little change in the output of the singlemode fiber of Example 12 during the entire cycle.

The temperature and humidity tests for the multimode fiber of Example 11 and the singlemode fiber of Example 12 are reported in Table IX

TABLE IX

| Time (min.) | Temp. (°C.) | dB* MM** | dB* SM*** |
|---|---|---|---|
| 0 | 40.8 | 0.006 | 0.000 |
| 7 | 65.0 | −1.179 | −0.120 |
| 12 | 65.0 | −0.663 | −0.178 |
| 18 | 25.4 | −0.148 | −0.138 |
| 25 | 65.0 | −0.908 | −0.234 |
| 30 | 64.8 | −0.608 | −0.216 |
| 35 | 4.9 | −0.276 | −0.285 |
| 40 | −10.1 | −0.269 | −0.203 |
| 45 | 7.6 | −0.499 | −0.194 |
| 50 | 21.6 | −0.205 | −0.189 |

*decibel
**multimode
***singlemode

As seen in Table IX there is no discernible effect due to humidity. Therefore, the photocurable polyimide coating does not significantly affect the optical characteristics of the glass optical fiber.

COATING ABRASION RESISTANCE

This test was conducted in a manner similar to that described in FOTP-66, Test Method for Measuring Relative Abrasion Resistance of Optical Waveguide Coatings and Buffers. The photocurable polyimide coated glass fiber was tested to determine the relative resistance of the coating to abrasion. The coated fiber was subjected to 60 grit calcined alumina. Ten samples of the fiber from Example 11 and 10 samples of the fiber from Example 12 were tested. Five samples of Comparative Example A were used to determine a relative comparison between the coated fiber of the present invention and a commercial material.

The abrasion resistance of the fiber coatings and buffers was determined from the amount of abrasive required to wear through the coating. A stream of alumina was allowed to fall one inch from the outlet of a flow guide tube, strike the fiber, and accumulate in a catch bin. A 100 gram weight was used to keep the fiber in tension under the alumina stream. After the weight dropped, the abrasive that was collected in the catch bin was weighed and the mean value of the ten test samples was calculated.

The mean amount of abrasive required to break the multimode fiber of Example 11 was 1290 grams. The mean amount of abrasive required to break the singlemode fiber of Example 12 was 1255 grams. The mean amount of abrasive required to break the fiber of Comparative Example A was 1436 grams. Thus, the photocurable polyimide coating of the present invention performed well when compared with a commercial material having a similar coating thickness.

SHEAR RESISTANCE OF COATING

This test was conducted in a manner similar to that described in FOTP-178, Measurements of Strip Force Required for Mechanically Removing Coatings from Optical Fibers. Ten samples of the multimode fiber of Example 11 were tested to determine the stripping force required to mechanically remove the coating from the optical fiber along the longitudinal axis.

A Klien Fiber Optic ® stripping tool with a 0.006 inch blade was used to remove the coating. The tests were conducted at room temperature. The stripping tool was constructed so that the blades formed a circular aperture when butted together. The stripping tool was mounted in a tensile strength tester using clamps to ensure that the fiber was pulled in a direction normal to the plane of the blades. The fiber was potted into a brass tube so that the fiber could be gripped by the tensile tester. Once the fiber was attached to the tensile tester, and inserted into the stripping tool, the fiber coating was severed 3 cm from the end of the fiber. The coating was then stripped by moving the stripping tool down at a constant rate of 500 mm/min. The maximum force required to accomplish this removal was recorded. Approximately 3 cm of coating was removed from the fiber and then visually inspected for coating residue. If the fiber broke, the results were not included.

The fibers yielded a mean strip force of 1.375 Newtons. No residue remained on the fiber. Therefore, the photocurable polyimide coating of the present invention can be removed from the fiber without excessive force. Typically, commercial coated fibers require that the coating be burned off or that aggressive chemicals be used to remove the coating.

MICROBEND TEST

This test was conducted in a manner similar to that described in FOTP-68, Optical Fiber Microbend Test Procedure. Five samples of the multimode fiber of Example 11 were tested to determine their microbend sensitivity. The same test was performed on a multimode 100/110/126 Comparative Example A fiber.

The fiber was placed between two plates. The plates were aluminum with silicon-carbide sandpaper (220 grit) affixed to the surface of each plate. The fiber was laid across the lower plate such that it looped four times and allowed sufficient length at the end of the plated to loop the fiber with a bend diameter greater than 100 mm. Cladding modes were stripped at the input and output ends of the fiber, and the light source was set to insert light into the cladding as well as the core (i.e., overfilled launch condition). A 1000 gram weight was added (in increments of 500 grams) to the top plate. All five samples were from the same spool and were less than 10 m in length.

The multimode fiber was injected with an 850 nanometer LED which was monitored using a 2 by 2 coupler, i.e., one input leg was injected by the LED, one output leg was detected as a reference and the other output leg was used to launch light into the multimode fiber. First, without the top plate in place, the input and output alignment of the test fiber was optimized until minimum output power was detected and that power was recorded as the reference power. The top plate was then placed over the test sample, and after allowing the microbend effects to stabilize, the output power was measured and recorded. Weight was then added in five 500 gram increments and the output power was recorded for each weight. After the last weight was added, the top plate was removed, the sample was allowed to relax for five minutes, and the final output power was recorded.

The fiber was visually examined using a 10× power magnification. The visual examination checked for cracking, splitting or for any other signs which would suggest that the integrity of the coating was compromised.

The change in optical transmittance was calculated for each sample and the examples were averaged. The results are reported in Table X.

TABLE X

| Weight (kg) | Example 11 Avg. Attenuation. (dB)/ Standard. Deviation | Comparative Example A Avg. Attenuation. (dB)/ Standard. Deviation |
| --- | --- | --- |
| no plate | 0/0 | 0/0 |
| 1.0 | 4.1/1.4 | 6.8/3.8 |
| 1.5 | 9.5/3.2 | 11.6/5.2 |
| 2.0 | 13.7/2.1 | 15.1/7.1 |
| 2.5 | 17.5/2.0 | 20.6/10.2 |
| 3.0 | 21.8/2.75 | 22.4/9.8 |
| 3.5 | 24.6/1.9 | |
| no plate | | 1.9/12.9 |

As can be seen in Table X, both Example 11 and Comparative Example A are microbend sensitive. However, the microbend sensitivity might be expected with a step index multimode fiber with a 5 micrometer coating thickness and the loss was acceptable in this situation.

Example 13

Using 6FDA (8.886 g) and OBA (4.006 g), the polyimide was prepared in a manner similar to Example 1 to provide approximately 10 g of polyimide. Inherent viscosity 1.61 dl/g (0.5% solution in NMP). The photosensitivity was tested and no reactivity was found. This example was prepared to demonstrate that a polyimide prepared from a diamine having no substituents ortho to the amine groups did not provide a photosensitive polyimide.

Examples 14–16 were prepared as described in Example 1. Examples with different number average molecular weights were tested for photosensitivity. Photosensitivity data is reported in Table XI. The smaller the photosensitivity at a particular thickness, the better the photosensitivity.

TABLE XI

EXAMPLES 14–16

| Example. Number | Composition | MWn* | Photosensitivity (mJ/cm$^2$) |
|---|---|---|---|
| 14 | 6FDA/BTDA/DMDE (50/50/100) | 4,680 | 272 |
| 15 | 6FDA/BTDA/DMDE (50/50/100) | 10,540 | 164 |
| 16 | 6FDA/BTDA/DMDE (50/50/100) | 15,550 | 69 |

*Number Average Molecular Weight

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

That which is claimed is:

1. A method of protecting a glass optical fiber from abrasion comprising coating a glass optical fiber with a photocurable polyimide coating comprising recurring units of

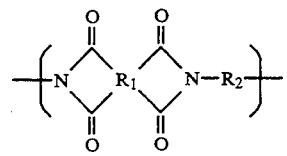

wherein R$_1$ comprises a tetravalent dianhydride moiety in a mole ratio of from about 10 to about 70 mole percent of

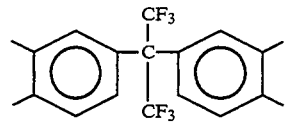

and from about 90 to about 30 mole percent of tetravalent photosensitizing moiety; R$_2$ is

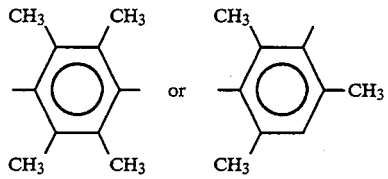

and wherein the number molecular weight average is at least 10,000 g/mol.

2. The method of protecting a glass optical fiber of claim 1 wherein R1 is from 50 to 60 mole percent tetravalent benzophenone moiety.

3. The method of protecting a glass optical fiber of claim 1 wherein the tetravalent photosensitizing moiety is

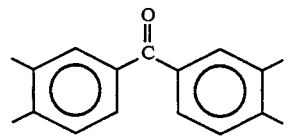

4. The method of protecting a glass optical fiber of claim 1 wherein R$_1$ is from about 50 to about 90 mole percent tetravalent benzophenone moiety.

* * * * *

UNITED STATES PATENT AND TRADEMARK OFFICE
CERTIFICATE OF CORRECTION

PATENT NO. : 5,427,862
DATED : June 27, 1995
INVENTOR(S) : David D. Ngo, et al

It is certified that error appears in the above-indentified patent and that said Letters Patent is hereby corrected as shown below:

| Col. | Line | |
|------|------|---|
| 12 | 41 | in "TABLE I" under the column "COMMENTS" and in the row "7" patent reads "Need to increase viscosity increase" patent should read --Need to increase viscosity-- |

Signed and Sealed this

Twenty-eighth Day of November 1995

Attest:

BRUCE LEHMAN

Attesting Officer

Commissioner of Patents and Trademarks